(12) United States Patent
Han et al.

(10) Patent No.: US 11,335,582 B2
(45) Date of Patent: May 17, 2022

(54) MICRO LED DISPLAY SUBSTRATE AND MANUFACTURING METHOD THEREOF

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Bo Han, Beijing (CN); Jianwei Qin, Beijing (CN); Lei Lv, Beijing (CN); Dongmei Xie, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 273 days.

(21) Appl. No.: 16/618,235

(22) PCT Filed: Mar. 25, 2019

(86) PCT No.: PCT/CN2019/079464
§ 371 (c)(1),
(2) Date: Nov. 29, 2019

(87) PCT Pub. No.: WO2020/103365
PCT Pub. Date: May 28, 2020

(65) Prior Publication Data
US 2021/0343567 A1 Nov. 4, 2021

(30) Foreign Application Priority Data
Nov. 20, 2018 (CN) .......................... 201811382262.3

(51) Int. Cl.
H01L 21/683 (2006.01)
H01L 25/075 (2006.01)
H01L 33/62 (2010.01)

(52) U.S. Cl.
CPC ...... *H01L 21/6835* (2013.01); *H01L 25/0753* (2013.01); *H01L 33/62* (2013.01);
(Continued)

(58) Field of Classification Search
CPC . H01L 21/6835; H01L 25/0753; H01L 33/62; H01L 2221/68368;
(Continued)

(56) References Cited

U.S. PATENT DOCUMENTS 6,961,993 B2 * 11/2005 Oohata ................. G09F 27/008
29/832
10,096,740 B1 * 10/2018 Chen ..................... H01L 27/156
(Continued)

FOREIGN PATENT DOCUMENTS

CN 105493298 A 4/2016
CN 105870265 A 8/2016
(Continued)

OTHER PUBLICATIONS

International Search Report dated Aug. 20, 2019, issued in counterpart application No. PCT/CN2019/079464. (11 pages).
(Continued)

*Primary Examiner* — Vu A Vu
(74) *Attorney, Agent, or Firm* — WHDA, LLP

(57) ABSTRACT

The present disclosure relates to a method for manufacturing a micro LED display substrate. The method may include forming an array of micro LEDs on an epitaxial wafer; transferring the array of micro LEDs on the epitaxial wafer to an adhesive layer on a surface of a transfer substrate assembly; and transferring the array of micro LEDs on the surface of the transfer substrate assembly onto corresponding pads on a driving substrate respectively.

17 Claims, 11 Drawing Sheets

(52) U.S. Cl.
CPC ............... *H01L 2221/68354* (2013.01); *H01L 2221/68368* (2013.01); *H01L 2221/68381* (2013.01); *H01L 2933/0066* (2013.01)

(58) Field of Classification Search
CPC ... H01L 2221/68381; H01L 2933/0066; H01L 2221/68354
USPC .......................................................... 438/28
See application file for complete search history.

(56) References Cited

U.S. PATENT DOCUMENTS

| | | | |
|---|---|---|---|
| 10,141,287 B2 | 11/2018 | Zou et al. | |
| 10,468,472 B2 * | 11/2019 | Chaji | .................... H01L 25/167 |
| 2011/0133216 A1 | 6/2011 | Sugawara | |
| 2018/0204973 A1 * | 7/2018 | Jeung | ....................... H01L 33/32 |
| 2018/0219123 A1 | 8/2018 | Wang et al. | |

FOREIGN PATENT DOCUMENTS

| | | | |
|---|---|---|---|
| CN | 107978548 A | 5/2018 | |
| CN | 108513684 A | 9/2018 | |
| CN | 108538878 A | 9/2018 | |
| CN | 109473532 A | 3/2019 | |

OTHER PUBLICATIONS

Office Action dated Sep. 3, 2019, issued in counterpart CN application No. 201811382262.3, with English translation. (12 pages).
Office Action dated May 19, 2020, issued in counterpart CN Application No. 201811382262.3, with English translation (7 pages).

* cited by examiner

MICRO LED DISPLAY SUBSTRATE AND MANUFACTURING METHOD THEREOF

CROSS-REFERENCE TO RELATED APPLICATIONS

This application claims benefit of the filing date of Chinese Patent Application No. 201811382262.3 filed on Nov. 20, 2018, the disclosure of which is hereby incorporated in its entirety by reference.

TECHNICAL FIELD

The present disclosure relates to display technology, in particular, to a Micro LED display substrate and a manufacturing method thereof.

BACKGROUND

In recent year, a Light Emitting Diode (LED) has become more and more miniaturized. Therefore, it has become possible to manufacture a display substrate in which a micro LED array is arranged as a pixel in recent years. The LED is more reliable and has longevity with respect to an Organic Light Emitting Diode (OLED). Thus, Micro LED display technology is a new type of display technology that will surpass OLED display technology in the future.

BRIEF SUMMARY

An embodiment of the present disclosure provides a method for manufacturing a micro LED display substrate. The method may include forming an array of micro LEDs on an epitaxial wafer; transferring the array of micro LEDs on the epitaxial wafer to an adhesive layer on a surface of a transfer substrate assembly; and transferring the array of micro LEDs on the surface of the transfer substrate assembly onto corresponding pads on a driving substrate respectively.

Optionally, the transfer substrate assembly comprises a transfer substrate, and the adhesive layer comprises a UV photo-degradable adhesive.

Optionally, transferring the array of micro LEDs on the transfer substrate assembly onto the corresponding pads on the driving substrate respectively comprises aligning a surface of the transfer substrate having the array of micro LEDS with a surface of the driving substrate having the corresponding pads; and performing a failure treatment to the adhesive layer selectively to release the array of micro LEDs onto the corresponding pads on the driving substrate respectively.

Optionally, performing the failure treatment to the adhesive layer selectively to release the array of micro LEDs onto the corresponding pads on the driving substrate respectively comprises placing a mask plate having a plurality of windows on a side of the transfer substrate opposite from the driving substrate; and applying ultraviolet light on a side of the mask plate opposite from the transfer substrate to degrade parts of the adhesive layer corresponding to the plurality of windows of the mask plate to release the array of micro LEDs onto the corresponding pads on the driving substrate.

Optionally, the method, after releasing the array of micro LEDs onto the corresponding pads on the driving substrate; further comprises heating the driving substrate to fix the array of micro LEDs to the corresponding pads.

Optionally, transferring the array of micro LEDs on the surface of the transfer substrate assembly onto the corresponding pads on the driving substrate respectively further comprises, before aligning the surface of the transfer substrate having the array of micro LEDS with the surface of the driving substrate having the corresponding pads, coating a pressure sensitive adhesive layer on the surface of the driving substrate having the corresponding pads. Adhesion strength of the pressure sensitive adhesive layer to the micro LEDs is less than adhesion strength of the UV photo-degradable adhesive layer to the micro LEDs.

Optionally, the UV photo-degradable adhesive comprises a viscous monomer, a plasticizer, a tackifying resin and a photosensitive resin.

Optionally, the viscous monomer comprises one or more compound selected from the group consisting of ethyl acrylate, 2-ethylhexyl acrylate, and butyl acrylate.

Optionally, the photosensitive resin is an aliphatic urethane acrylate having a plurality of functional groups.

Optionally, the method further comprises N times of repeated steps of forming an array of micro LEDs capable of emitting a certain color on an epitaxial wafer; transferring the array of micro LEDs capable of emitting the certain color on the epitaxial wafer to the adhesive layer on the surface of the transfer substrate assembly; and transferring the array of micro LEDs capable of emitting the certain color on the surface of the transfer substrate assembly onto corresponding pads on a driving substrate respectively; so that a plurality of micro LEDs capable of emitting N different colors of light is transferred onto the corresponding pads on the surface of the driving substrate respectively.

Optionally, the mask plate having the plurality of windows is used in the N times of the repeated steps, the plurality of windows of the mask plate is corresponding to different areas of the driving substrate in each time of the repeated steps, and a size of an interval between the plurality of windows is N times of a size of an interval between the corresponding pads on the driving substrate.

Optionally, the array of micro LEDs at unexposed part of the adhesive layer by the ultraviolet light remain adhered to the transfer substrate being configured to be transferred to a next driving substrate.

Optionally, N is three to transfer an array of micro LEDs capable of emitting red color light, an array of micro LEDs capable of emitting green color light, and an array of micro LEDs capable of emitting blue color light onto the corresponding pads on the surface of the driving substrate respectively, and the size of the interval between the plurality of windows is three times of the size of the interval between the corresponding pads on the driving substrate.

Optionally, the transfer substrate assembly comprises an auxiliary transfer substrate and a transfer substrate, an organic glue layer is on a surface of the auxiliary transfer substrate, and a UV curable adhesive layer is on a surface of transfer substrate.

Optionally, transferring the array of micro LEDs on the epitaxial wafer to the adhesive layer on the surface of the transfer substrate assembly comprises aligning the surface of the auxiliary transfer substrate having the organic glue layer with the surface of the epitaxial wafer having the array of micro LEDs to adhere the array of micro LEDs on the epitaxial wafer to the organic glue layer on the auxiliary transfer substrate; aligning the transfer substrate with the auxiliary transfer substrate so that the UV curable adhesive layer on the surface of the transfer substrate is in contact with the array of micro LEDs on the auxiliary transfer substrate; placing a mask plate having a plurality of windows on a side of the transfer substrate opposite from the auxiliary transfer substrate; and applying ultraviolet light to a side of the mask plate opposite from the transfer substrate such that the array of micro LEDs at positions corresponding to the plurality of windows of the mask plate are adhered to the UV curable adhesive layer from the organic glue layer.

Optionally, transferring the array of micro LEDs on the surface of the transfer substrate assembly onto corresponding pads on the surface of the driving substrate respectively comprises aligning a surface of the transfer substrate having the array of micro LEDS with the surface of the driving substrate having the corresponding pads and performing a failure treatment to the UV curable adhesive layer to release the array of micro LEDs onto the corresponding pads on the driving substrate respectively.

Optionally, performing the failure treatment to the UV curable adhesive layer to release the array of micro LEDs onto the corresponding pads on the driving substrate respectively comprises decomposing and melting the UV curable adhesive layer at a temperature in a range from about 140° C. to about 160° C., thereby releasing the array of micro LEDs onto the corresponding pads of the driving substrate respectively.

Optionally, steps of the method for manufacturing a micro LED display substrate are repeated N times to transfer a plurality of micro LEDs capable of emitting N different colors of light onto the corresponding pads on the surface of the driving substrate respectively.

Optionally, one mask plate having the plurality of windows is used in N times of repetition of steps of the method for manufacturing a micro LED display substrate, and a size of an interval between the plurality of windows is N times of a size of an interval between the corresponding pads on the driving substrate.

Optionally, steps of the method for manufacturing a micro LED display substrate are repeated three times to transfer an array of micro LEDs capable of emitting red color light, an array of micro LEDs capable of emitting green color light, and an array of micro LEDs capable of emitting blue color light onto the corresponding pads on the surface of the driving substrate respectively, and the size of the interval between the plurality of windows is three times of the size of the interval between the corresponding pads on the driving substrate.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
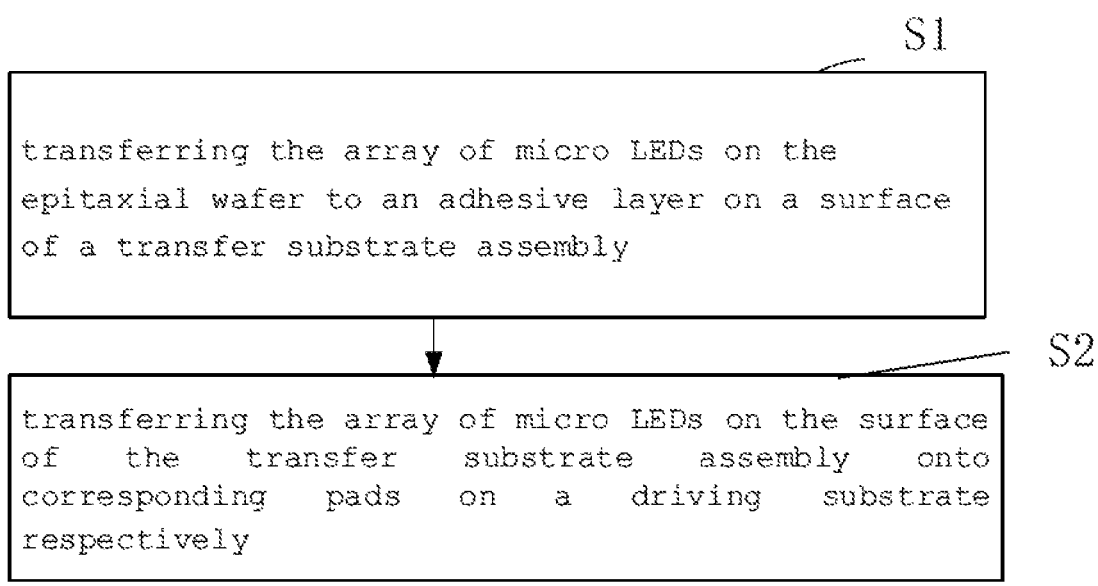
FIG. 1 is a flow chart of a method for manufacturing a micro LED display substrate according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-19. When referring to the figures, like structures and elements shown throughout are indicated with like reference numerals.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Coupled" and the like are not limited to physical or mechanical connections, but may include electrical connections, whether direct or indirect. "Upper," "lower," "left," "right," etc. are only used to indicate the relative positional relationship. When the absolute position of the object being described is changed, the relative positional relationship may also change accordingly.

In the description of the following embodiments, specific features, structures, materials or characteristics may be combined in any suitable manner in any one or more embodiments or examples.

As shown in FIGS. 1 to 19, one embodiment of the present disclosure provides a method for manufacturing a micro LED display substrate. The method includes transferring an array of micro LEDs 104 distributed at certain intervals on an epitaxial wafer 101 to corresponding pads 302 of a driving substrate 301 through a transfer substrate assembly. In one embodiment, as shown in FIG. 1, the step of transferring the micro LEDs 104 on the epitaxial wafer 101 to the corresponding pads 302 of the driving substrate 301 includes Steps S1 and S2:

In Step S1, the transfer substrate assembly is aligned with the epitaxial wafer 101 to transfer the micro LEDs 104 on the epitaxial wafer 101 to the adhesive layer of the transfer substrate assembly.

Wherein, the micro LEDs 104 are first grown on a surface of the epitaxial wafer 101, and then the micro LEDs 104 are cut into an array structure based on a required size of the micro LED. Here, the size p of the interval between the array of the micro LED 104s needs to correspond to the size of the interval between the pads 302 on the drive substrate 301. The size of the interval between the pads 302 on the drive substrate 301 may be an integer multiple of the size of the interval between the array of micro LED 104s on the epitaxial wafer 101.

It should be noted that the surface of the epitaxial wafer 101 having the micro LEDs 104 is the surface of the epitaxial wafer 101 for aligning with the transfer substrate assembly.

In step S2, the transfer substrate assembly is aligned with the drive substrate 301, and the adhesive layer on the transfer substrate assembly is subjected to a failure treatment to release the micro LEDs 104 on the transfer substrate assembly to the corresponding pads 302 of the drive substrate 301.

Here, the specific operational process for the failure treatment of the adhesive layer on the transfer substrate assembly needs to be differentiated based on different types of the adhesive layers. Moreover, the type of the adhesive layer is selected based on the type of the transfer substrate assembly and the adhesion transfer mode.

It can be seen that the manufacturing method of the micro LED 104 display substrate provided by the embodiment of the present disclosure does not require special design of a transfer device and supporting facilities. In the embodiments, the micro LEDs 104 on the epitaxial wafer 101 are adhered to the adhesive layer on the transfer substrate assembly, and through a mature and simplified method, the failure treatment of the above-mentioned adhesive layer is performed so that the micro LEDs 104 can be released onto the pads 302 of the driving substrate 301. The micro LEDs 104 may be batch-grabbed or transferred onto the micro LED 104 display substrate. The manufacturing method of the micro LED 104 display substrate provided by the embodiment of the present disclosure has advantages such as low cost, high transfer efficiency, and the like.

For purpose of illustration, two specific embodiments of the present disclosure are described in detail below.

Embodiment 1

Figure 2:
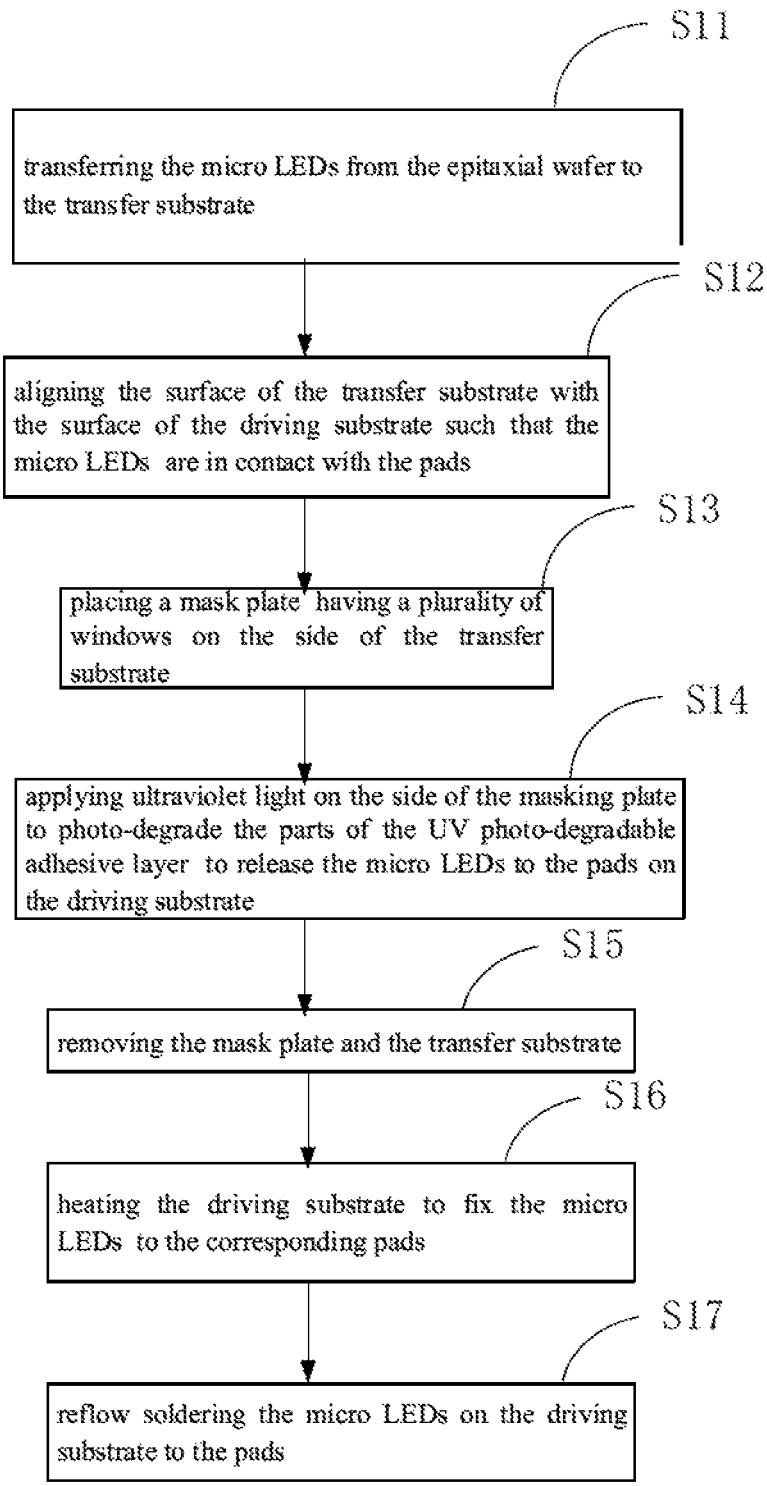
FIG. 2 is a flowchart of a method for manufacturing a micro LED display substrate according to one embodiment of the present disclosure.
Figure 3:
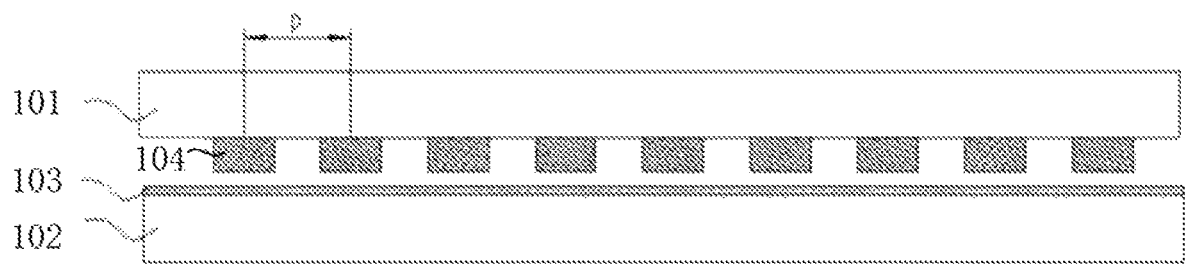
FIGS. 3-11 are schematic diagrams showing a method for manufacturing a micro LED display substrate according to one embodiment of the present disclosure.
Figure 4:
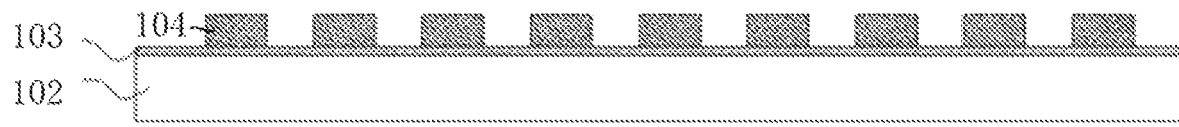

As shown in FIGS. 2 to 11, in the manufacturing method of the micro LED 104 display substrate provided by the embodiment of the present disclosure, the transfer substrate assembly includes a transfer substrate 102 and an adhesive layer which the transfer substrate 102 used to adhere the micro LEDs 104. The adhesive layer is a UV photo-degradable adhesive layer 103. As shown in FIG. 2, the manufacturing method according to one embodiment of the present disclosure includes the following steps S11-S17:

In step S11, as shown in FIG. 3, the surface of the transfer substrate 102 having the UV photo-degradable adhesive layer 103 and the surface of the epitaxial wafer 101 having the micro LEDs 104 are aligned together, so that the micro LEDs 104 are transferred to the transfer substrate 102 due to the adhesion of the UV photo-degradable adhesive layer 103. FIG. 4 shows that the micro LEDs 104 have been transferred onto the UV photo-degradable adhesive layer 103 of the transfer substrate 102.

The transfer substrate 102 may be made of a transparent material, and a layer of the above-mentioned UV photo-degradable adhesive may be coated on a surface of the transfer substrate 102 for aligning with the epitaxial wafer 101 and the driving substrate 301. Here, the transfer substrate 102 is preferably made of a rigid material such as glass. Of course, the transfer substrate 102 can be made of other transparent rigid materials. In one embodiment, in order to ensure the precision during the transferring process, an expansion coefficient of the transfer substrate is substantially the same as that of the driving substrate 301.

In the embodiment, it should be noted that the UV photo-degradable adhesive layer 103 coated on the surface of the transfer substrate 102 can prevent problem of partial transferring due to insufficient contact between some of the micro LEDs 104 and the transfer substrate 102 when the two rigid surfaces of the transfer substrate 102 and the epitaxial wafer 101 are aligning with each other.

Optionally, the UV photo-degradable adhesive can be prepared by using a viscous monomer having a lower glass transition temperature with addition of an appropriate amount of a plasticizer, a tackifying resin, and/or a photosensitive resin. The UV photo-degradable adhesive 103 has characteristics of a pressure-sensitive adhesive 402 under normal conditions, and can fail quickly after exposure to UV light. Further, the viscous monomer may be a combination of one or more of ethyl acrylate, 2-ethylhexyl acrylate, and butyl acrylate. Moreover, the photosensitive resin may be an aliphatic urethane acrylate having a plurality of functional groups.

Figure 5:
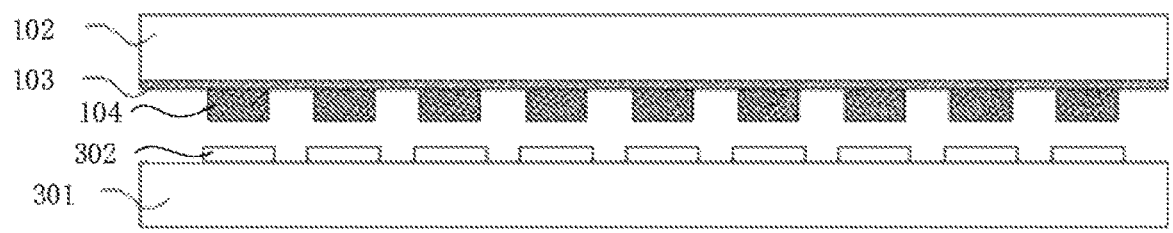

In Step S12, as shown in FIG. 5, the surface of the transfer substrate 102 having the micro LEDs 104 is aligned with the surface of the driving substrate having the pads 302 such that the micro LEDs 104 are in contact with the pads 302.

It should be noted that when the transfer substrate 102 is aligned with the epitaxial wafer 101, the epitaxial wafer 101 is pressed downward to adhere the micro LEDs 104 to the UV photo-degradable adhesive layer 103. When the transfer substrate 102 is aligned with the driving substrate 301, the UV photo-degradable adhesive layer 103 is subjected to failure treatment in a direction from the transfer substrate 102 to the driving substrate 301.

Figure 6:
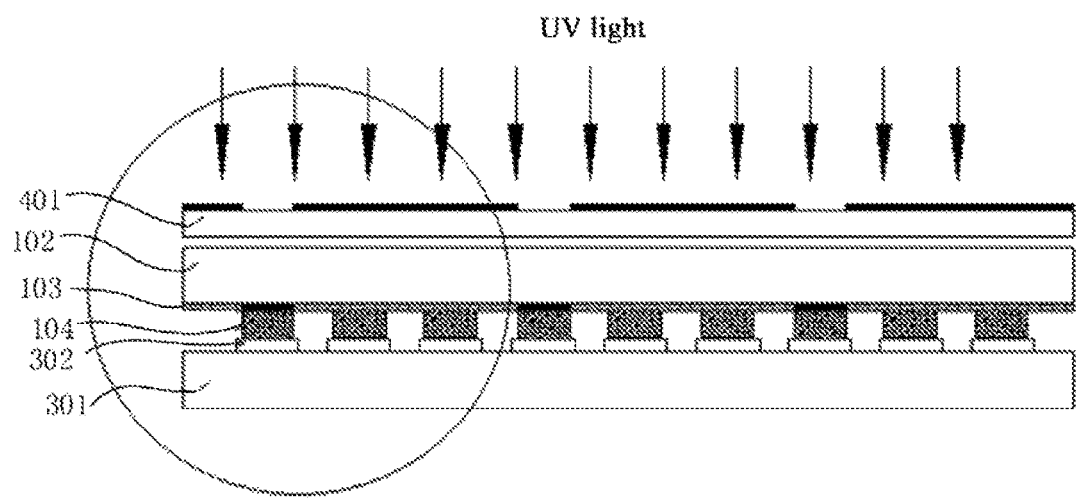
Figure 7:
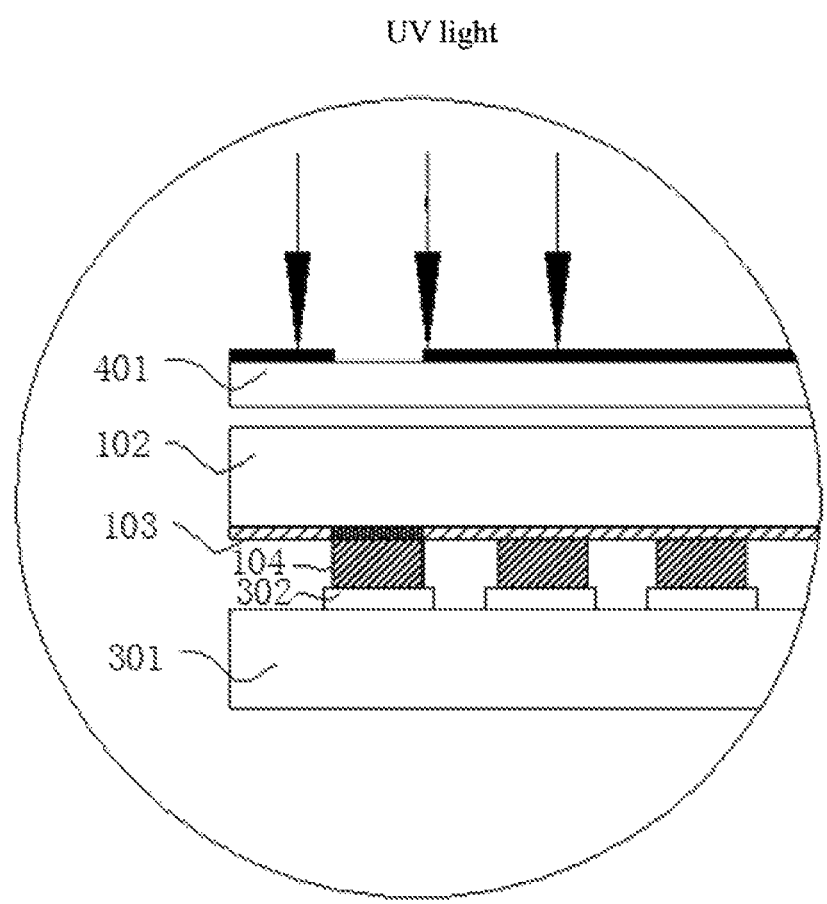

In step S13, as shown in FIG. 6 and FIG. 7, a mask plate 401 having a plurality of windows is placed on the side of the transfer substrate 102 opposite from the driving substrate 301.

The mask plate 401 is disposed so that the UV photo-degradable adhesive layer 103 is selectively treated to release the micro-LEDs 104 corresponding to the windows of the mask plate to the corresponding pads 302 on the driving substrate 301. Therefore, the positions of windows of the mask plate 401 in the present embodiment correspond to the positions of the pads 302 on the driving substrate 301. Specifically, the positions of the windows of the mask plate 401 relate to the distribution of the required micro LEDs 104 on the pads 302.

In one embodiment, when it is necessary to distribute the micro LEDs 104 capable of emitting light of the same color on the pads 302 of the driving substrate 301, the interval between the windows on the mask plate 401 and the interval between the pads 302 on the drive substrate 301 have a same size. In one embodiment, when the micro LEDs 104 capable of emitting light of N colors are regularly distributed on the pads 302 of the driving substrate 301, a size of the interval between the windows on the mask plate 401 is N times of a size of the interval between the pads 302 on the driving substrate 301, so that the micro LEDs 104 capable of emitting N colors of light are transferred to the corresponding pads 302 of the driving substrate through N times of transferring using the transfer substrates 102. As such, a color display substrate may be produced. In the embodiments, the size of the interval between the windows on the mask plate 401 is the shortest distance between the adjacent windows on the mask plate 401. The size of the interval between the pads 302 on the driving substrate 301 is the shortest distance between the adjacent pads on the driving substrate.

In Step S14, as shown in FIG. 6 and FIG. 7, ultraviolet light is applied on the side of the masking plate 401 opposite from the transfer substrate 102 to photo-degrade the parts of the UV photo-degradable adhesive layer 103 corresponding to the windows of the masking plate 401 to release the micro LEDs 104 to the pads 302 on the driving substrate.

Figure 8:
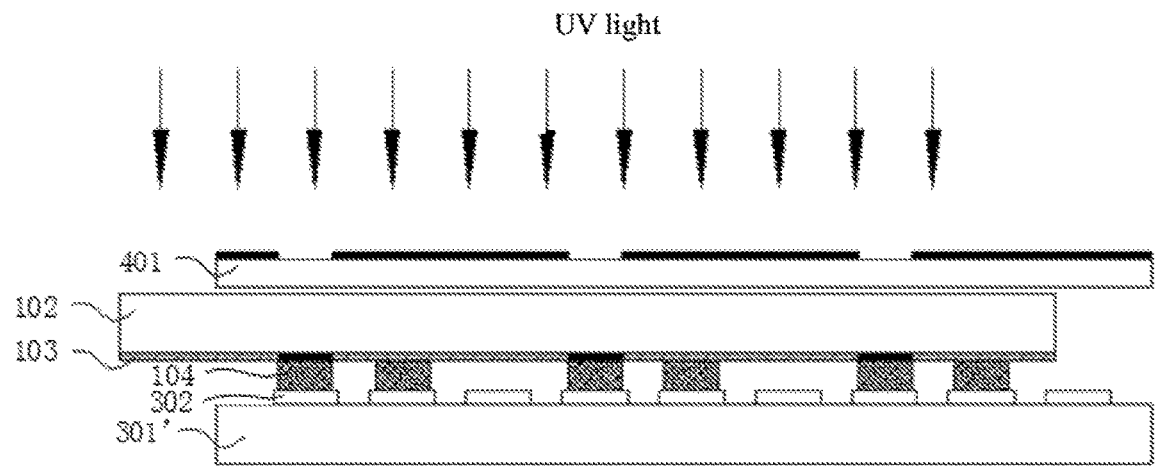
Figure 9:
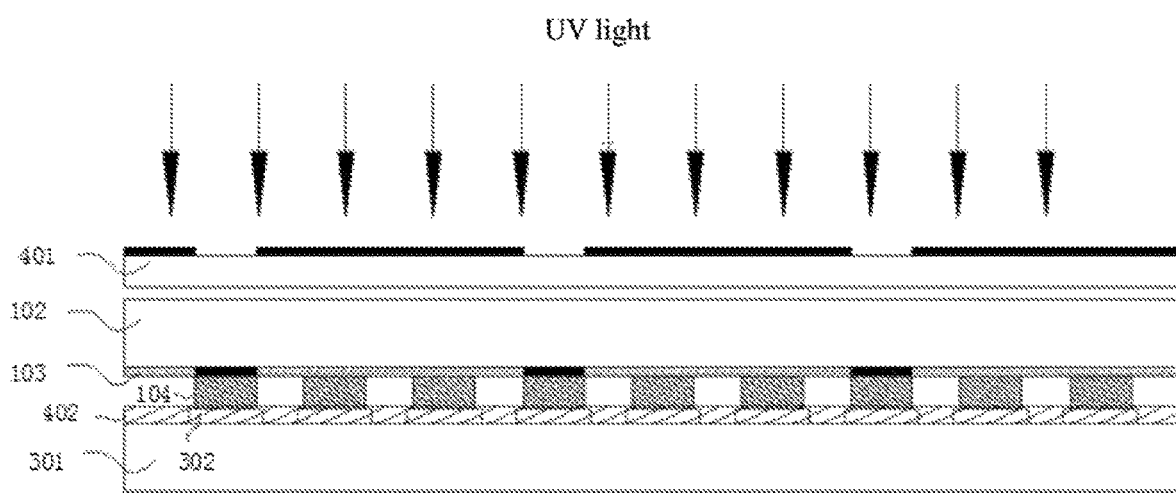

Due to the arrangement of the mask plate 401, the ultraviolet light can only irradiate the parts of the UV photo-degradable adhesive layer 103 corresponding to the windows of the masking plate 401. Under the exposure of the ultraviolet light, the parts of the UV light-degradable adhesive layer 103 fail, and the micro LEDs 104 on the exposed parts of the UV light-degradable adhesive layer 103 are released to the corresponding pads 302 of the driving substrate 301. The unexposed parts of the UV photo-degradable adhesive layer 103 do not fail, and the micro LEDs 104 on the unexposed parts of the UV photo-degradable adhesive layer 103 remain adhered to the transfer substrate 102. As shown in FIG. 8, the transfer substrate 102 can be transferred to the next driving substrate 301' and transfers the micro LEDs 104 onto the pads 302' on the next driving substrate 301'. Furthermore, when aligning with the next driving substrate 301', the same mask plate 401 can be used, thereby reducing the manufacturing cost.

In step S15, the mask plate 401 and the transfer substrate 102 are removed.

It should be noted that after the transfer substrate 102 is removed, the transferred micro LEDs 104 may have a positional shift on the pads 302 of the driving substrate 301. In one embodiment, in order to solve this problem, as shown FIG. 9, before the transfer substrate 102 is aligned with the driving substrate 301, the surface of the driving substrate 301 for bonding the micro LEDs 104 is coated with a pressure sensitive adhesive 402. The adhesion strength of the pressure sensitive adhesive 402 to the micro LEDs 104 needs to be less than the adhesion strength of the UV photo-degradable adhesive layer 103 to the micro LEDs 104. As such, the micro LEDs 104 adhered to the parts of the UV photo-degradable adhesive layer 103 which are not exposed to ultraviolet light are carried away together with the transfer substrate 102 and not left on the drive substrate 301.

Figure 10:
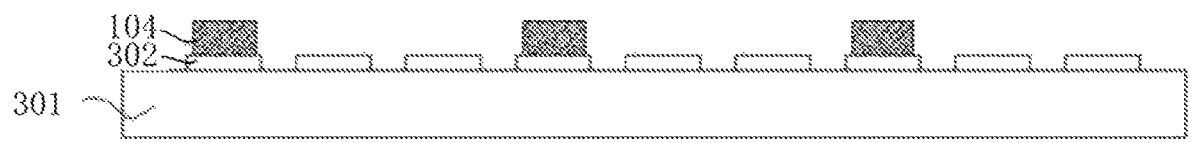

In Step S16, as shown in FIG. 10, after the micro LEDs 104 are released onto the pads 302 of the driving substrate 301, the driving substrate 301 is heated to fix the micro LEDs 104 to the corresponding pads 302.

The heating of the driving substrate 301 here is to achieve light soldering of the micro LEDs 104 and the corresponding pads 302. After the required micro LEDs 104 are completely transferred to the pads 302 of the drive substrate 301, step S17 is performed, and the micro LEDs 104 on the driving substrate 301 are soldered to the pads 302 by reflow soldering to be fixed thereon.

In the present disclosure, one micro LED may correspond to one or more pads on the driving substrate. In one embodiment, one micro LED may correspond to one pad on the driving substrate. In one embodiment, one micro LED may correspond to a pair of pads on the driving substrate.

In order to further illustrate the method of fabricating the micro LED display substrate according to some embodiments of the present disclosure, an example will be described below.

In one embodiment, three colors are required to be mixed on the driving substrate 301 to realize a color display. Three epitaxial wafers 101 and three transfer substrates 102 are required, and the epitaxial wafers 101 and the transfer substrates 102 are in one-to-one correspondence. The micro LEDs 104 on the three epitaxial wafers 101 respectively emit red color light, green color light, and blue color light. The interval between the windows on the mask plate 401 is three times the interval between the pads 302 on the driving substrate 301. The pads 302 on the driving substrate 301 are divided into three groups as needed. The first group of pads is used to dispose micro LEDs 104 of the red color light, the second group of pads 302 are used to dispose micro LEDs 104 of the green color light, and the third group of pads 302 are used to dispose micro LEDs 104 of the blue color light.

During the process, the first transfer substrate 102 needs to be first aligned with the epitaxial wafer 101 having the micro LEDs 104 capable of emitting R light so that the micro LEDs 104 on the epitaxial wafer 101 are adhered to the first transfer substrate 102. Then, the first transfer substrate 102 is aligned with the driving substrate 301, and a mask plate is placed on a surface of the transfer substrate 102 opposite from the driving substrate 301 so that the windows on the mask plate 401 correspond to the first group of pads 302 on the driving substrate 301. Then, after being exposed to ultraviolet light, the micro LEDs 104 capable of emitting R light on the first transfer substrate 102 are transferred onto the first group of pads 302. The first transfer substrate 102 is transferred to the next driving substrate 301' to transfer the micro LEDs 104.

Then, the second transfer substrate 102 is aligned with the epitaxial wafer 101 having the micro LEDs 104 capable of emitting G light so that the micro LEDs 104 on the epitaxial wafer 101 are adhered to the second transfer substrate. Then, the second transfer substrate 102 is aligned with the driving substrate 301, and a mask plate 401 is placed on a surface of the transfer substrate 102 opposite from the driving substrate 301 so that the windows on the mask plate 401 correspond to the second group of pads 302 on the driving substrate 301. Then, after being exposed to ultraviolet light, the micro LEDs 104 capable of emitting G light on the second transfer substrate 102 are transferred onto the second group of pads 302.

Then, the third transfer substrate 102 needs to be aligned with the epitaxial wafer 101 having the micro LEDs 104 capable of emitting B light so that the micro LEDs 104 on the epitaxial wafer 101 are adhered to the third transfer substrate. Then, the third transfer substrate 102 is aligned with the driving substrate 301, and a mask plate is placed on a surface of the transfer substrate 102 opposite from the driving substrate 301 so that the windows on the mask plate 401 correspond to the third group of pads 302 on the driving substrate 301. Then, after being exposed to ultraviolet light, the micro LEDs 104 capable of emitting B light on the third transfer substrate 102 are transferred onto the third group of pads 302. In this process, the mask plate 401 can be reused.

Figure 11:

Finally, after the three colors of the micro LEDs 104 are transferred to the corresponding pads 302 of the driving substrate 301, all the micro LEDs 104 and the pads 302 are soldered by reflow soldering. As shown in FIG. 11, the final display substrate can display colors of red color light, green color light, and blue color light.

Embodiment 2

Figure 12:
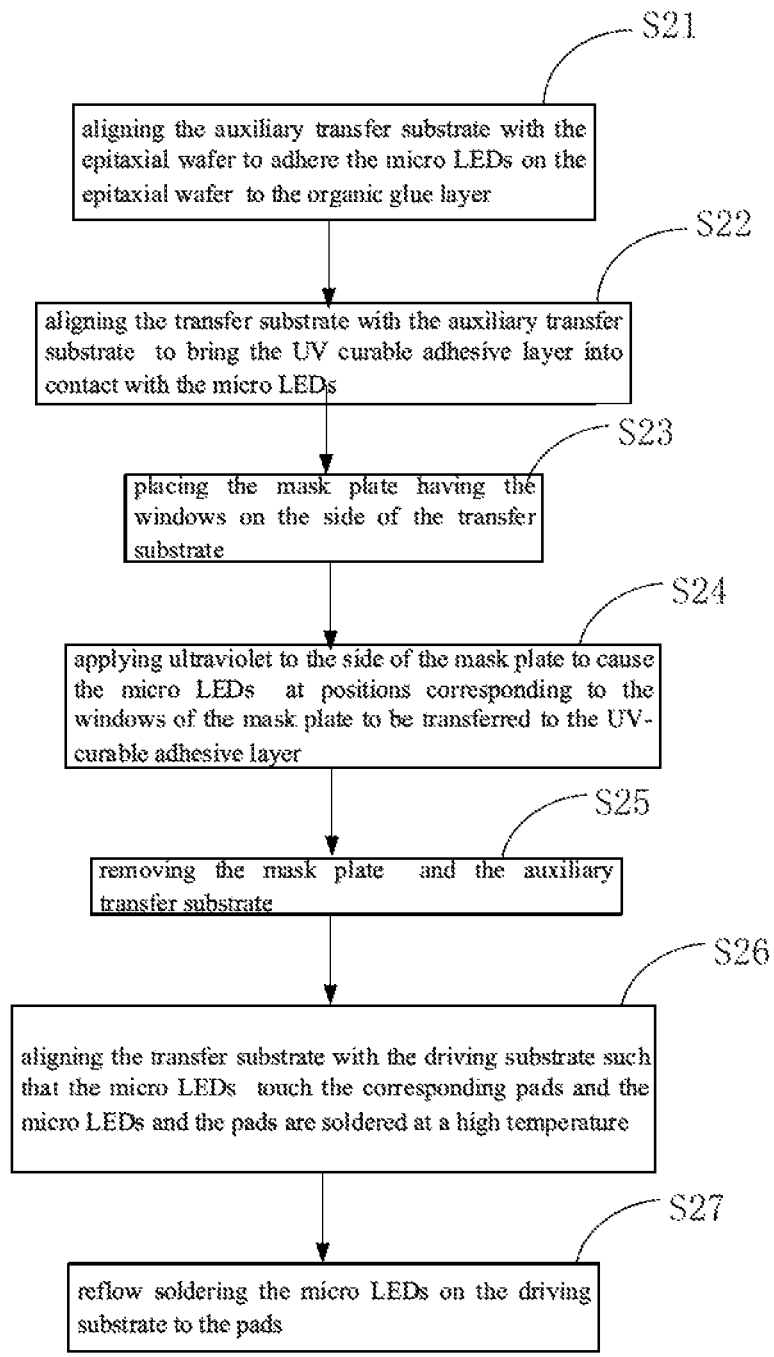
FIG. 12 is a flowchart of a method for manufacturing a micro LED display substrate according to one Embodiment of the present disclosure.
Figure 13:
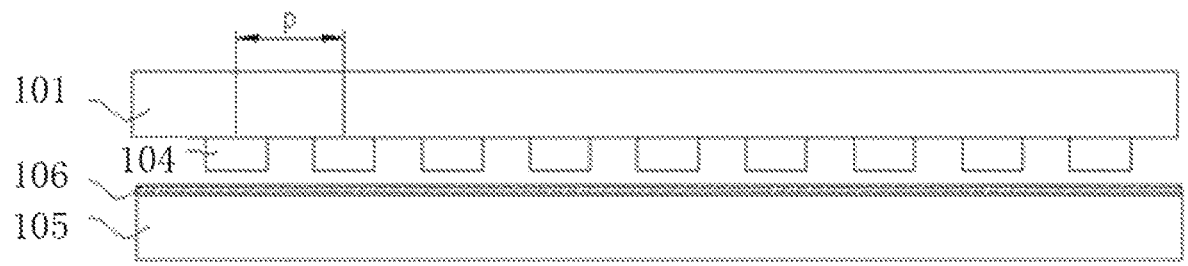
FIGS. 13-19 are schematic diagrams showing a method for manufacturing a micro LED display substrate according to one embodiment of the present disclosure.

As shown in FIG. 12 to FIG. 19, in the manufacturing method of the micro LED 104 display substrate provided by one embodiment of the present disclosure, the transfer substrate assembly includes an auxiliary transfer substrate 105 and a transfer substrate 102. The auxiliary transfer substrate 105 has an organic glue layer 106 thereon, and the transfer substrate 102 has a UV curable adhesive layer 107 thereon. The manufacturing method first transfers the micro LEDs 104 on the epitaxial wafer 101 to the auxiliary transfer substrate 105, and then transfers the micro LEDs 104 on the auxiliary transfer substrate 105 to the driving substrate 301. As shown in FIG. 12, the following steps S21-S27 are specifically included:

In step S21, as shown in FIG. 13, the auxiliary transfer substrate 105 is aligned with the epitaxial wafer 101 to adhere the micro LEDs 104 on the epitaxial wafer 101 to the organic glue layer 106.

Figure 14:
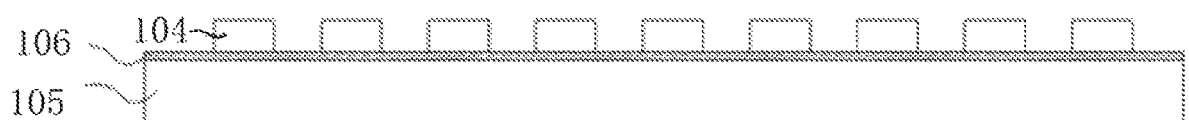

When the auxiliary transfer substrate 105 is aligned against the epitaxial wafer 101, the micro LEDs 104 on the epitaxial wafer 101 are transferred to the auxiliary transfer substrate 105 due to the adhesion of the organic glue layer 106, as shown in FIG. 14.

The auxiliary transfer substrate 105 may be a rigid material having a flat surface such as glass or metal. A layer of organic glue is coated on a surface of the auxiliary transfer substrate 105 aligning with the epitaxial wafer 101. The adhesion strength of the organic glue layer 106 to the micro LEDs 104 has certain requirements: it is necessary to ensure that the micro LEDs 104 are fixed when the epitaxial wafer 101 is removed, and there is no movement of the micro LEDs 104 to cause the change of the interval among the micro LEDs 104 due to insufficient adhesion strength.

Figure 15:
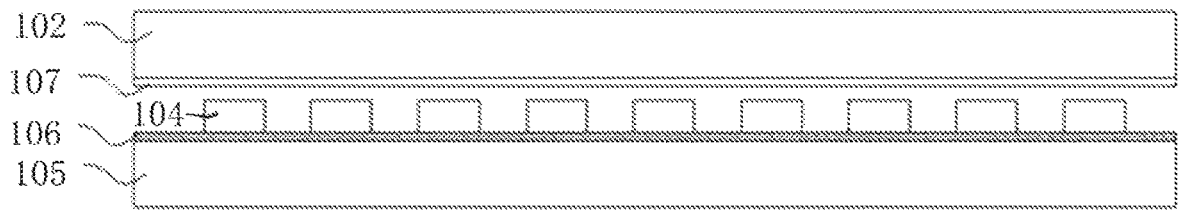

In step S22, as shown in FIG. 15, the transfer substrate 102 is aligned with the auxiliary transfer substrate 105 to bring the UV curable adhesive layer 107 into contact with the micro LEDs 104 on the auxiliary transfer substrate 105.

The surface of the transfer substrate 102 for aligning with the auxiliary transfer substrate 105 is coated with a layer of UV curable adhesive. The layer of UV curable adhesive may be made of an acrylate to which a photoinitiator is added. The UV curable adhesive has a low adhesion strength before curing and a high adhesion strength after curing.

In one embodiment, the transfer substrate 102 here is made of a transparent material such as a glass.

Figure 16:
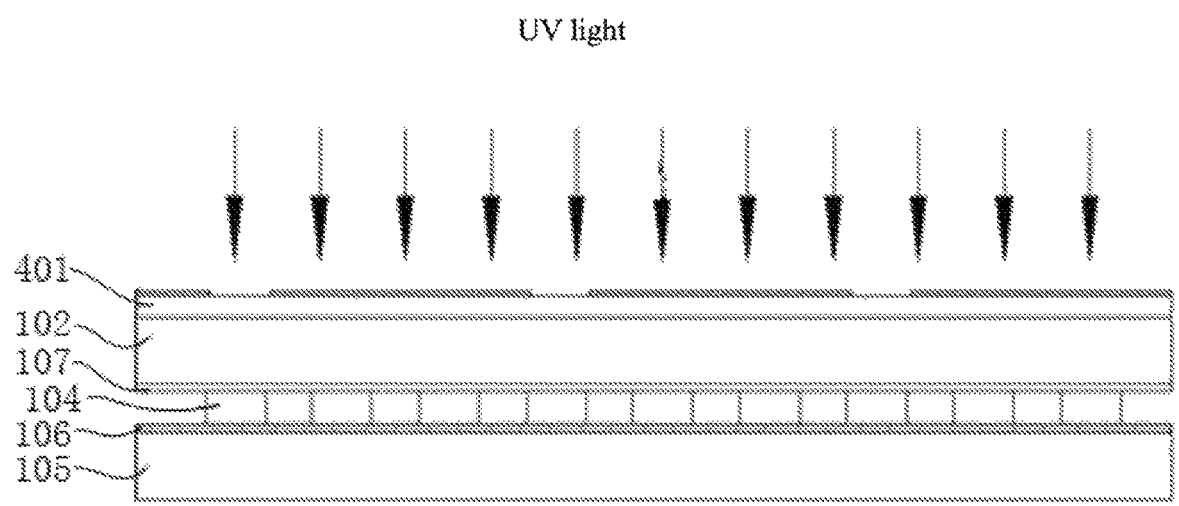

In step S23, as shown in FIG. 16, the mask plate 401 having the windows is placed on the side of the transfer substrate 102 opposite from the auxiliary transfer substrate 105. The function of the mask plate 401 is similar to that of the mask plate 401 in the manufacturing method provided in the first embodiment, and the positions of the windows on the mask plate 401 are also similar to those in the manufacturing method provided in the first embodiment. Similarly, it is also possible to manufacture a color display substrate.

In step S24, with continued reference to FIG. 16, ultraviolet exposure is applied to the side of the mask plate 401 opposite from the transfer substrate 102 to cause the micro LEDs 104 at positions corresponding to the windows of the mask plate 401 to be transferred from the organic glue layer 106 to the UV-curable adhesive layer 107.

Due to the arrangement of the mask plate 401, the ultraviolet light can only irradiate the parts of the UV-curable adhesive layer 107 corresponding to the windows of the mask plate 401. Under the exposure of ultraviolet light, the curing adhesion strength of the UV-curable adhesive layer 107 is enhanced, and the corresponding micro LEDs 104 on the auxiliary transfer substrate 105 are grasped or transferred onto the transfer substrate 102. Since the adhesion strength of the unexposed UV-curable adhesive 107 is less than that of the organic glue 106, the uncured UV-cured adhesive layer 107 does not cure so that the corresponding micro LEDs 104 on the auxiliary transfer substrate 105 cannot be grasped onto the transfer substrate 102. Moreover, the process is simple and easy to perform and can be completed, for example, in about 10 seconds.

Figure 17:
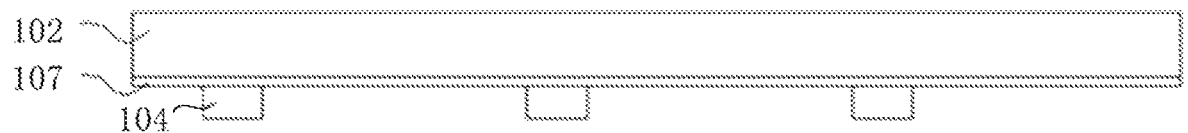

In step S25, the mask plate 401 and the auxiliary transfer substrate 105 are removed. As shown in FIG. 17, the micro LEDs 104 have been transferred onto the transfer substrate 102. At this time, the auxiliary transfer substrate 105 can be aligned with the next transfer substrate with the aid of the mask plate 401 to perform the transfer operation of micro LEDs 104.

Figure 18:
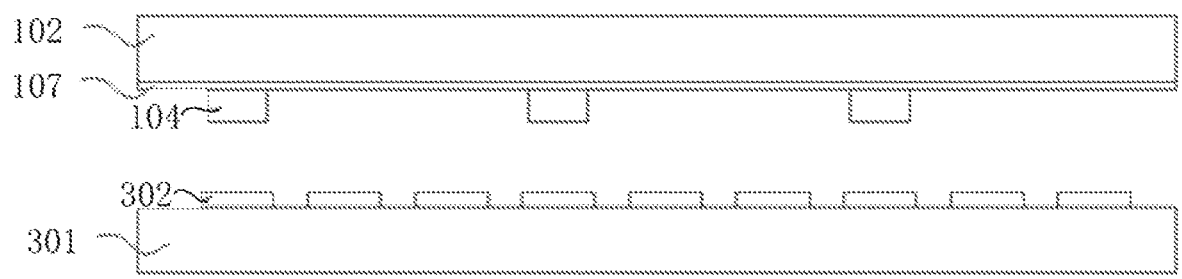

In step S26, as shown in FIG. 18, the transfer substrate 102 is aligned with the driving substrate 301 such that the micro LEDs 104 touch the corresponding pads 302. The micro LEDs 104 and the pads 302 are soldered at a high temperature so that the UV curable adhesive layer 107 decomposes and melts, and the micro LEDs 104 are released and fixed to the pads 302 of the driving substrate 301.

Figure 19:

After the required micro LEDs 104 are completely transferred to the pads 302 of the driving substrate 301, step S27 is performed, and the micro LEDs 104 on the driving substrate 301 are soldered to the pads 302 by reflow soldering to be fixed, as shown in FIG. 19.

In this embodiment, the high-temperature soldering requires raising temperature in two steps. The first step is to raise the temperature to a relatively low temperature, for example, in a range from about 140° C. to about 160° C. to mainly decompose and melt the UV curable adhesive layer and release the micro LEDs 104 from the transfer substrate 102. The second step is to raise the temperature to a relatively high temperature, for example, in a range from about 190° C. to about 210° C. to realize the complete bonding process of the micro LEDs 104 and the pads 302 of the driving substrate 301 after the transfer of the micro LED 104 is completed. It should be noted that if the temperature in the first step is too high, the other pads 302 on the drive substrate 301 that have not been transferred the micro LED 104 may be damaged or destroyed.

It should be noted that, in this manufacturing method, after each transferring by the transfer substrate 102, the surface of the transfer substrate 102 is cleaned to remove the remains of UV-curable adhesive layer 107 thereon and a new UV-cured adhesive layer 107 is then recoated thereon.

In order to further explain the method of fabricating the display substrate of the Micro LEDs 104 in this embodiment, an example will be described below:

In one embodiment, to realize a color display that requires three colors to be mixed on the driving substrate 301, three epitaxial wafers 101, three auxiliary transfer substrates 105, and one transfer substrate 102 are required. The epitaxial wafers 101 and the auxiliary transfer substrates 105 are in one-to-one correspondence. The micro LEDs 104 on the three epitaxial wafers 101 respectively emit red color light, green color light, and blue color light. The interval between the windows on the mask plate 401 is three times the interval between the pads 302 on the driving substrate 301. The pads 302 on the driving substrate 301 are divided into three groups according to requirements. The first group of pads 302 is used to dispose micro LEDs 104 emitting red color light, a second group of pads 302 is used to dispose micro LEDs 104 emitting green color light, and a third group of pads 302 is used to dispose micro LEDs 104 emitting blue color light.

During the process, the first auxiliary transfer substrate 105 needs to be aligned with the epitaxial wafer 101 having the micro LEDs 104 capable of emitting red color light, and the micro LEDs 104 on the epitaxial wafer 101 are adhered to the first auxiliary transfer substrate 105, which is then aligned with the transfer substrate 102. The side of the transfer substrate 102 opposite from the auxiliary transfer substrate 105 is covered with a mask plate 401, so that the windows on the mask plate 401 corresponds to the corresponding micro LEDs 104. Upon exposure to ultraviolet light, the micro LEDs 104 capable of emitting red color light on the first auxiliary transfer substrate 105 are transferred onto the transfer substrate 102. Then, The transfer substrate 102 is aligned with the driving substrate 301 such that the micro LEDs 104 capable of emitting red color light are in contact with the first group of pads 302 of the driving substrate 301. The micro LEDs 104 capable of emitting red color light are transferred onto the first group of pads 302 of the driving substrate 301 under the action of high temperature soldering.

Then, the surface of the transfer substrate 102 is cleaned and a UV curable adhesive layer 107 is recoated on the surface of the transfer substrate 102. Then, the second auxiliary transfer substrate 105 is aligned with the epitaxial wafer 101 having the micro LEDs 104 capable of emitting green color light, and the micro LEDs 104 on the epitaxial wafer 101 are adhered to the second auxiliary transfer substrate 105, which is then aligned with the transfer substrate 102. The side of the transfer substrate 102 opposite from the auxiliary transfer substrate 105 is covered with the mask plate 401, so that the windows on the mask plate 401 corresponds to the corresponding Micro LEDs 104. Upon exposure to ultraviolet light, the micro LEDs 104 capable of emitting green color light on the second auxiliary transfer substrate 105 are transferred onto the transfer substrate 102. Then, The transfer substrate 102 is aligned with the driving substrate 301 such that the micro LEDs 104 capable of emitting green color light are in contact with the second group of pads 302 of the driving substrate 301. The micro LEDs 104 capable of emitting green color light are transferred onto the second group of pads 302 of the driving substrate 301 under the action of high temperature soldering.

Then, the surface of the transfer substrate 102 is cleaned again and a UV curable adhesive layer 107 is recoated on the surface of the transfer substrate. Then, the third auxiliary transfer substrate 105 is aligned with the epitaxial wafer 101 having the micro LEDs 104 capable of emitting blue color light. The micro LEDs 104 on the epitaxial wafer 101 are adhered to the third auxiliary transfer substrate 105, which is then aligned with the transfer substrate 102. The side of the transfer substrate 102 opposite from the auxiliary transfer substrate 105 is covered with the mask plate 401, so that the windows on the mask plate 401 corresponds to the corresponding micro LEDs 104. Upon exposure to ultraviolet light, the micro LEDs 104 capable of emitting blue color light on the third auxiliary transfer substrate 105 are transferred onto the transfer substrate 102. Then, The transfer substrate 102 is aligned with the driving substrate 301 such that the micro LEDs 104 capable of emitting blue color light are in contact with the third group of pads 302 of the driving substrate 301. The micro LEDs 104 capable of emitting blue color light are transferred onto the third group of pads 302 of the driving substrate 301 under the action of high temperature soldering.

In this process, the mask plate 401 can be reused. Finally, after the three colors of the micro LEDs 104 are transferred to the corresponding pads 302 of the driving substrate 301, all of the micro LEDs 104 and the pads 302 are soldered by reflow soldering. As shown in FIG. 11 *e*, the display substrate produced by the manufacturing method according to one embodiment of the present disclosure can display red color light, green color light, and blue color light.

In summary, the manufacturing method of the micro LED display panel provided by the embodiment of the present disclosure does not require special design of a transferring device and supporting facilities. The micro LEDs 104 on the epitaxial wafer 101 are adhered to the adhesive layer on the transfer substrate assembly. The process of releasing the micro LED 104 onto the pad 302 of the driving substrate through a failure treatment of the above-mentioned adhesive layer is mature and simple. It can be seen that the manufacturing method can perform the batch transferring of the micro LEDs 104 to produce a colored micro LED 104 display panel, which has low cost and high transfer efficiency.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A method for manufacturing a micro LED display substrate, comprising:
    forming an array of micro LEDs on an epitaxial wafer;
    transferring the array of micro LEDs on the epitaxial wafer to an adhesive layer on a surface of a transfer substrate assembly; and
    transferring the array of micro LEDs on the surface of the transfer substrate assembly onto corresponding pads on a driving substrate respectively;
    wherein the transfer substrate assembly comprises a transfer substrate, and the adhesive layer comprises a UV photo-degradable adhesive;
    wherein transferring the array of micro LEDs on the transfer substrate assembly onto the corresponding pads on the driving substrate respectively comprises:
    aligning a surface of the transfer substrate having the array of micro LEDS with a surface of the driving substrate having the corresponding pads; and
    performing a failure treatment to the adhesive layer selectively to release the array of micro LEDs onto the corresponding pads on the driving substrate respectively; and
    wherein transferring the array of micro LEDs on the surface of the transfer substrate assembly onto the corresponding pads on the driving substrate respectively further comprises, before aligning the surface of the transfer substrate having the array of micro LEDS with the surface of the driving substrate having the corresponding pads,
    coating a pressure sensitive adhesive layer on the surface of the driving substrate having the corresponding pads;
    wherein adhesion strength of the pressure sensitive adhesive layer to the micro LEDs is less than adhesion strength of the UV photo-degradable adhesive layer to the micro LEDs.

2. The method according to claim 1, wherein performing the failure treatment to the adhesive layer selectively to release the array of micro LEDs onto the corresponding pads on the driving substrate respectively comprises:
    placing a mask plate having a plurality of windows on a side of the transfer substrate opposite from the driving substrate; and
    applying ultraviolet light on a side of the mask plate opposite from the transfer substrate to degrade parts of the adhesive layer corresponding to the plurality of windows of the mask plate to release the array of micro LEDs onto the corresponding pads on the driving substrate.

3. The method according to claim 2, after releasing the array of micro LEDs onto the corresponding pads on the driving substrate; further comprising:
  heating the driving substrate to fix the array of micro LEDs to the corresponding pads.

4. The method according to claim 1, wherein the UV photo-degradable adhesive comprises a viscous monomer, a plasticizer, a tackifying resin and a photosensitive resin.

5. The method according to claim 4, wherein the viscous monomer comprises one or more compound selected from the group consisting of ethyl acrylate, 2-ethylhexyl acrylate, and butyl acrylate.

6. The method according to claim 4, wherein the photosensitive resin is an aliphatic urethane acrylate having a plurality of functional groups.

7. The method according to claim 2, comprising N times of repeated steps of:
  forming an array of micro LEDs capable of emitting a certain color on an epitaxial wafer;
  transferring the array of micro LEDs capable of emitting the certain color on the epitaxial wafer to the adhesive layer on the surface of the transfer substrate assembly; and
  transferring the array of micro LEDs capable of emitting the certain color on the surface of the transfer substrate assembly onto corresponding pads on a driving substrate respectively; so that a plurality of micro LEDs capable of emitting N different colors of light is transferred onto the corresponding pads on the surface of the driving substrate respectively.

8. The method according to claim 7, wherein the mask plate having the plurality of windows is used in the N times of the repeated steps, the plurality of windows of the mask plate is corresponding to different areas of the driving substrate in each time of the repeated steps, and a size of an interval between the plurality of windows is N times of a size of an interval between the corresponding pads on the driving substrate.

9. The method according to claim 8, wherein the array of micro LEDs at unexposed part of the adhesive layer by the ultraviolet light remain adhered to the transfer substrate being configured to be transferred to a next driving substrate.

10. The method according to claim 8, wherein N is three to transfer an array of micro LEDs capable of emitting red color light, an array of micro LEDs capable of emitting green color light, and an array of micro LEDs capable of emitting blue color light onto the corresponding pads on the surface of the driving substrate respectively, and the size of the interval between the plurality of windows is three times of the size of the interval between the corresponding pads on the driving substrate.

11. A method for manufacturing a micro LED display substrate, comprising:
  forming an array of micro LEDs on an epitaxial wafer;
  transferring the array of micro LEDs on the epitaxial wafer to an adhesive layer on a surface of a transfer substrate assembly; and
  transferring the array of micro LEDs on the surface of the transfer substrate assembly onto corresponding pads on a driving substrate respectively;
  wherein the transfer substrate assembly comprises an auxiliary transfer substrate and a transfer substrate, an organic glue layer is on a surface of the auxiliary transfer substrate, and a UV curable adhesive layer is on a surface of transfer substrate.

12. The method according to claim 11, wherein transferring the array of micro LEDs on the epitaxial wafer to the adhesive layer on the surface of the transfer substrate assembly comprises:
  aligning the surface of the auxiliary transfer substrate having the organic glue layer with the surface of the epitaxial wafer having the array of micro LEDs to adhere the array of micro LEDs on the epitaxial wafer to the organic glue layer on the auxiliary transfer substrate;
  aligning the transfer substrate with the auxiliary transfer substrate so that the UV curable adhesive layer on the surface of the transfer substrate is in contact with the array of micro LEDs on the auxiliary transfer substrate;
  placing a mask plate having a plurality of windows on a side of the transfer substrate opposite from the auxiliary transfer substrate; and
  applying ultraviolet light to a side of the mask plate opposite from the transfer substrate such that the array of micro LEDs at positions corresponding to the plurality of windows of the mask plate are adhered to the UV curable adhesive layer from the organic glue layer.

13. The method according to claim 11, wherein transferring the array of micro LEDs on the surface of the transfer substrate assembly onto corresponding pads on the surface of the driving substrate respectively comprises:
  aligning a surface of the transfer substrate having the array of micro LEDS with the surface of the driving substrate having the corresponding pads;
  performing a failure treatment to the UV curable adhesive layer to release the array of micro LEDs onto the corresponding pads on the driving substrate respectively.

14. The method according to claim 12, wherein performing the failure treatment to the UV curable adhesive layer to release the array of micro LEDs onto the corresponding pads on the driving substrate respectively comprises:
  decomposing and melting the UV curable adhesive layer at a temperature in a range from about 140° C. to about 160° C., thereby releasing the array of micro LEDs onto the corresponding pads of the driving substrate respectively.

15. The method according to claim 11, comprising N times of repeated steps of:
  forming an array of micro LEDs capable of emitting a certain color on an epitaxial wafer;
  transferring the array of micro LEDs capable of emitting the certain color on the epitaxial wafer to the adhesive layer on the surface of the transfer substrate assembly; and
  transferring the array of micro LEDs capable of emitting the certain color on the surface of the transfer substrate assembly onto corresponding pads on a driving substrate respectively; so that a plurality of micro LEDs capable of emitting N different colors of light is transferred onto the corresponding pads on the surface of the driving substrate respectively.

16. The method according to claim 14, wherein one mask plate having the plurality of windows is used in the N times of repeated steps, and a size of an interval between the plurality of windows is N times of a size of an interval between the corresponding pads on the driving substrate.

17. The method according to claim 15, wherein N is three to transfer an array of micro LEDs capable of emitting red color light, an array of micro LEDs capable of emitting green color light, and an array of micro LEDs capable of emitting blue color light onto the corresponding pads on the surface of the driving substrate respectively, and the size of the interval between the plurality of windows is three times of the size of the interval between the corresponding pads on the driving substrate.

* * * * *